(12) United States Patent
Then et al.

(10) Patent No.: US 10,574,187 B2
(45) Date of Patent: Feb. 25, 2020

(54) ENVELOPE-TRACKING CONTROL TECHNIQUES FOR HIGHLY-EFFICIENT RF POWER AMPLIFIERS

(71) Applicant: INTEL CORPORATION, Santa Clara, CA (US)

(72) Inventors: Han Wui Then, Portland, OR (US); Sansaptak Dasgupta, Hillsboro, OR (US); Marko Radosavljevic, Portland, OR (US); Seung Hoon Sung, Portland, OR (US); Sanaz K. Gardner, Portland, OR (US)

(73) Assignee: INTEL Corporation, Santa Clara, CA (US)

( * ) Notice: Subject to any disclaimer, the term of this patent is extended or adjusted under 35 U.S.C. 154(b) by 0 days.

(21) Appl. No.: 15/777,744

(22) PCT Filed: Dec. 21, 2015

(86) PCT No.: PCT/US2015/066998
§ 371 (c)(1),
(2) Date: May 21, 2018

(87) PCT Pub. No.: WO2017/111888
PCT Pub. Date: Jun. 29, 2017

(65) Prior Publication Data
US 2018/0342985 A1    Nov. 29, 2018

(51) Int. Cl.
*H03F 1/02* (2006.01)
*H03F 3/193* (2006.01)
(Continued)

(52) U.S. Cl.
CPC ........... *H03F 1/0222* (2013.01); *H01L 23/66* (2013.01); *H01L 29/2003* (2013.01);
(Continued)

(58) Field of Classification Search
CPC ........ H03F 1/0222; H03F 3/195; H03F 3/213; H03F 2200/18; H03F 2200/451;
(Continued)

(56) References Cited

U.S. PATENT DOCUMENTS 5,814,980 A  *  9/1998  Lewis ..................... G05F 3/247
                                                     323/282
2010/0045385 A1    2/2010  Pengelly
(Continued)

FOREIGN PATENT DOCUMENTS

JP    2001244763 A    9/2001
WO   2017/111888 A1   6/2017

OTHER PUBLICATIONS

International Search Report and Written Opinion received for PCT Application No. PCT/US2015/066998, dated Sep. 20, 2016. 13 pages.
(Continued)

*Primary Examiner* — Alexander O Williams
(74) *Attorney, Agent, or Firm* — Finch & Maloney PLLC

(57) ABSTRACT

Envelope-tracking control techniques are disclosed for highly-efficient radio frequency (RF) power amplifiers. In some cases, a III-V semiconductor material (e.g., GaN or other group III material-nitride (III-N) compounds) MOSFET including a high-k gate dielectric may be used to achieve such highly-efficient RF power amplifiers. The use of a high-k gate dielectric can help to ensure low gate leakage and provide high input impedance for RF power amplifiers. Such high input impedance enables the use of envelope-tracking control techniques that include gate voltage (Vg) modulation of the III-V MOSFET used for the RF power amplifier. In such cases, being able to modulate Vg of the RF power amplifier using, for example, a voltage regulator, can result in double-digit percentage gains in power-added efficiency (PAE). In some instances, the techniques may simultaneously utilize envelope-tracking control techniques that include drain voltage (Vd) modulation of the III-V MOSFET used for the RF power amplifier.

20 Claims, 5 Drawing Sheets

(51) Int. Cl.
*H01L 29/778* (2006.01)
*H01L 23/66* (2006.01)
*H01L 29/20* (2006.01)
*H01L 29/205* (2006.01)
*H01L 29/49* (2006.01)
*H01L 29/51* (2006.01)
*H03F 3/195* (2006.01)
*H03F 3/213* (2006.01)
*H01L 29/423* (2006.01)
*H01L 29/08* (2006.01)
*H01L 29/417* (2006.01)

(52) U.S. Cl.
CPC .......... *H01L 29/205* (2013.01); *H01L 29/495* (2013.01); *H01L 29/513* (2013.01); *H01L 29/517* (2013.01); *H01L 29/7786* (2013.01); *H01L 29/7787* (2013.01); *H03F 3/193* (2013.01); *H03F 3/195* (2013.01); *H03F 3/213* (2013.01); *H01L 29/0847* (2013.01); *H01L 29/41758* (2013.01); *H01L 29/4236* (2013.01); *H03F 2200/102* (2013.01); *H03F 2200/105* (2013.01); *H03F 2200/15* (2013.01); *H03F 2200/18* (2013.01); *H03F 2200/451* (2013.01)

(58) Field of Classification Search
CPC .......... H03F 2200/105; H03F 2200/15; H03F 3/193; H03F 1/02; H03F 2/213; H01L 29/2003; H01L 29/205; H01L 29/517; H01L 29/7787; H01L 29/513; H01L 29/7786; H01L 29/495; H01L 23/66; H01L 29/20; H01L 29/49

USPC .......................................................... 257/76
See application file for complete search history.

(56) References Cited

U.S. PATENT DOCUMENTS

| | | | |
|---|---|---|---|
| 2012/0264286 A1* | 10/2012 | Yeo | H01L 29/6653 438/595 |
| 2013/0292698 A1* | 11/2013 | Then | H01L 29/4236 257/76 |
| 2013/0313561 A1 | 11/2013 | Suh | |
| 2014/0213204 A1 | 7/2014 | Balteanu et al. | |
| 2016/0148846 A1* | 5/2016 | Ok | H01L 21/28008 |
| 2016/0197173 A1* | 7/2016 | Dewey | B82Y 10/00 257/20 |
| 2017/0133386 A1* | 5/2017 | Lee | H01L 21/823807 |
| 2017/0141218 A1* | 5/2017 | Iucolano | H01L 21/0254 |
| 2018/0040708 A1* | 2/2018 | Narayanan | H01L 29/517 |
| 2018/0350921 A1* | 12/2018 | Dasgupta | H01L 27/0924 |
| 2018/0374927 A1* | 12/2018 | Liu | H01L 21/28088 |
| 2019/0058042 A1* | 2/2019 | Then | H01L 29/78 |
| 2019/0058049 A1* | 2/2019 | Then | H01L 29/6684 |
| 2019/0088759 A1* | 3/2019 | Sung | H01L 21/28114 |

OTHER PUBLICATIONS

International Preliminary Report on Patentability received for PCT Application No. PCT/US2015/066998, dated Jun. 26, 2018, 10 pages.

* cited by examiner

ENVELOPE-TRACKING CONTROL TECHNIQUES FOR HIGHLY-EFFICIENT RF POWER AMPLIFIERS

BACKGROUND

A radio frequency (RF) power amplifier is a type of electronic amplifier used to convert a low-power radio frequency signal into a signal of significant power. RF power amplifiers are used to transmit RF signals between mobile devices and base stations located at far distances (e.g., greater than one mile). The efficiency of RF power amplifiers is an important factor of battery life in the mobile devices and power consumption (cost) in RF base stations. An envelope-tracking RF power amplifier allows for high RF power amplifier efficiencies to be achieved. Using envelope tracking, efficiency can be improved by causing the direct current (DC) power supply voltage of the power amplifier to be continuously adjusted and track the envelope of the RF input signal of the amplifier. By having the power supply voltage of the power amplifier track the envelope of the RF input signal, the amplifier can be maintained at or near a saturation point during operation, which is typically the most efficient region of operation.

BRIEF DESCRIPTION OF THE DRAWINGS

FIG. 1A shows an example plot illustrating experimental RF power amplifier envelope-tracking curves of varying drain voltages (Vd) with a fixed Vg of 1.5V. FIG. 1B shows an example plot 120 illustrating experimental RF power amplifier envelope-tracking curves of varying Vg with a fixed Vd of 3 V.

Figure 1A:
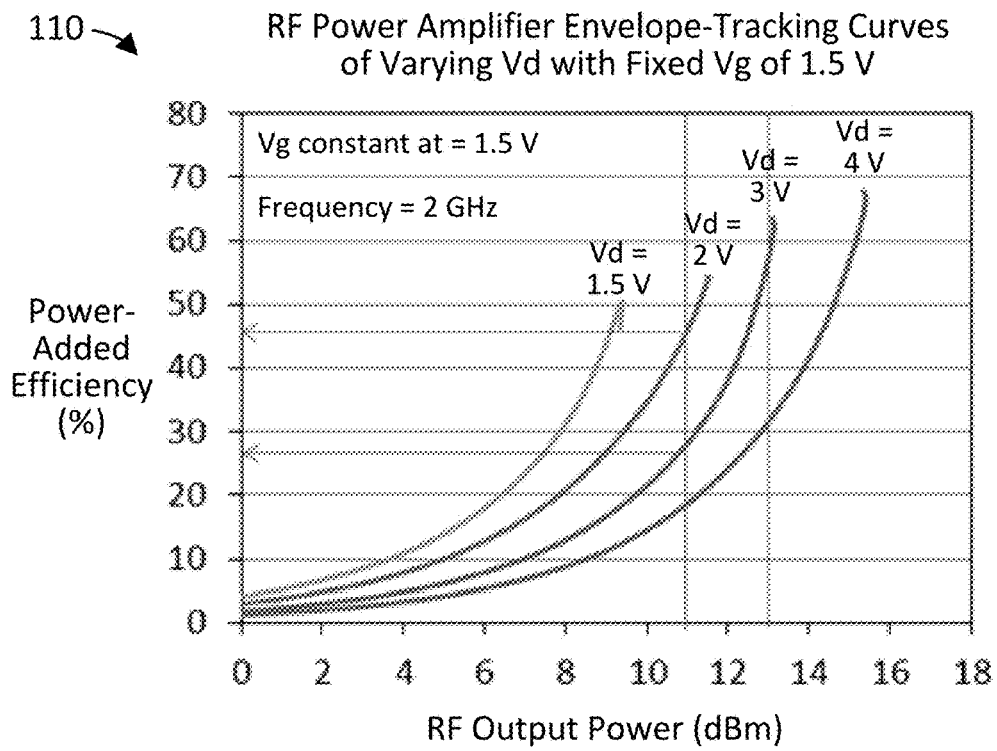
FIGS. 1A-B are provided to illustrate benefits of envelope-tracking control techniques that include modulating the gate bias or gate voltage (Vg) of a radio frequency (RF) power amplifier (PA), in accordance with an embodiment of this disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Envelope-tracking control techniques are disclosed for highly-efficient radio frequency (RF) power amplifiers. In some cases, a III-V semiconductor material (e.g., GaN or other group III material-nitride (III-N) compounds) MOSFET including a high-k gate dielectric may be used to achieve such highly-efficient RF power amplifiers. The use of a high-k gate dielectric can help to ensure low gate leakage and provide high input impedance for RF power amplifiers. Such high input impedance enables the use of envelope-tracking control techniques that include gate voltage (Vg) modulation of the III-V MOSFET used for the RF power amplifier. In such cases, being able to modulate Vg of the RF power amplifier using, for example, a voltage regulator, can result in double-digit percentage gains in power-added efficiency (PAE). The PAE of RF power amplifiers is an important factor of battery life in mobile handsets and of power consumption (cost) in RF base stations. In some instances, the techniques may simultaneously utilize envelope-tracking control techniques that include drain voltage (Vd) modulation of the III-V MOSFET used for the RF power amplifier. In some such instances, simultaneous envelope-tracking modulation of Vg and Vd may be used to achieve increased PAE gains, for example. Numerous variations and configurations will be apparent in light of this disclosure.

General Overview

As previously described, an envelope-tracking RF power amplifier is a key enabling circuit architecture that allows for high RF power amplifier efficiencies to be achieved. Generally, envelope-tracking techniques include modulating or adjusting DC supply voltage applied to a power amplifier based on the envelope of an input signal, and because power supply voltage is adjusted, the amplifier can operate at or near peak performance for the given instantaneous input power. Current techniques involve the use of a voltage regulator that is able to track the envelope of a transmitted RF signal and modulate the drain bias of an RF power amplifier in order to select the optimal bias condition that results in the highest power-added efficiencies (PAEs). This technique is particularly helpful in 3G, 4G, LTE, and 5G communication formats, for example, where the transmitted signals are characterized by large peak-to-average power. Transistor architectures used for RF power amplifiers in today's mobile devices, such as heterojunction bipolar transistors (HBTs) and high-electron-mobility transistors (HEMTs), have varying input impedance that is largely dependent on the input current. This is because bipolar transistors (e.g., HBT) are current-driven devices, while HEMTs have significant gate leakage due to the use of a Schottky gate. Therefore, input biases, such as gate voltage (Vg), are maintained constant in these devices and input matching is fixed to allow them to properly function. Accordingly, the only envelope-tracking technique that is available to these devices is drain voltage (Vd) modulation, which presents non-trivial issues such as lower efficiency at lower output powers, for example.

Thus, and in accordance with one or more embodiments of this disclosure, envelope-tracking control techniques are provided for highly-efficient RF power amplifiers. In some embodiments, a III-V semiconductor material metal-oxide-semiconductor field-effect transistor (MOSFET) including a high-k gate dielectric may be used to enable envelope-tracking control techniques that enhance the efficiency of RF power amplifiers. As variously used herein, III-V compounds/materials include at least one group III element (e.g., aluminum, gallium, indium, boron, thallium) and at least one group V element (e.g., nitrogen, phosphorus, arsenic, antimony, bismuth). As will be apparent in light of this disclosure, a III-V MOSFET may include a III-V semiconductor material channel, such as a GaN or indium gallium nitride (InGaN) channel, for example. Further, a high-k gate dielectric or high-k gate dielectric stack as described herein may include one or more layers of high-k dielectric materials, such as hafnium oxide (or hafnia), hafnium silicate, aluminum oxide, aluminum silicate, tantalum oxide, tantalum silicate, zirconium oxide, and zirconium silicate, to name some examples. As will also be apparent in light of this disclosure, in some embodiments, III-V MOSFETs including high-k gate dielectric can help to ensure low gate leakage current (e.g., at least 100,000 times reduction in gate leakage as compared to a Schottky gate), thereby providing high input impedance for RF power amplifiers. Such high input impedance enables the use of envelope-tracking control techniques including gate voltage (Vg) modulation of the RF power amplifier, in some embodiments. In some embodiments, the envelope-tracking control techniques using Vg modulation provide double digit percentage gains in RF power amplifier efficiency, as will be described in more detail below. Further, in some embodiments, envelope-tracking by modulation of both Vg and Vd may be used to achieve increased RF power amplifier efficiencies.

Figure 1B:
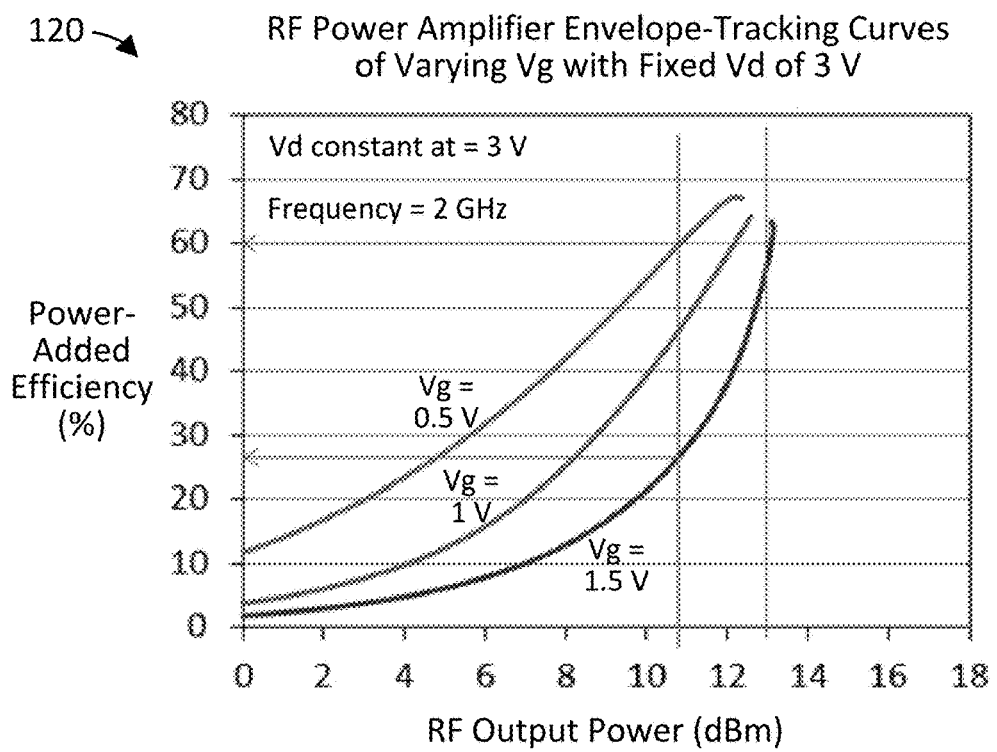

As previously described, envelope-tracking techniques including Vg modulation capabilities result in higher power-added efficiency (PAE) over envelope-tracking techniques with only Vd modulation capabilities. FIGS. 1A-B illustrate some benefits of envelope-tracking control techniques that include modulating the gate bias or gate voltage (Vg) of an RF power amplifier, in accordance with an embodiment of this disclosure. For instance, FIG. 1A shows an example plot 110 illustrating experimental RF power amplifier envelope-tracking curves of varying Vd with a fixed Vg of 1.5V. In FIGS. 1A-B, the X-axis of the plots includes RF output power (Pout) values (in dBms) and the Y-axis of the plots includes PAE values (in %s). In this example scenario, PAE=(Pout−Pin)/Pdc, where output power (Pout) is the power flowing out of the RF power amplifier over a specified frequency, input power (Pin) is the power flowing into the RF power amplifier input over a specified frequency range, and the DC power (Pdc) is supplied to the active device for the operation of the RF power amplifier. The example experimental data shown in FIGS. 1A-B is at an operating frequency of 2 GHz for illustration purposes only. The techniques as described herein are applicable to RF power amplifiers at any RF frequencies, such as RF frequencies in the range of 1 MHz to 100 GHz, or any other suitable frequency, depending on the end use or target application. Continuing with plot 110 in FIG. 1A, Vd curves for four different voltage values are shown (from left to right, voltages of 1.5, 2, 3, and 4 V). Tracking the RF Pout in plot 110, when RF Pout is 13 dBm, the maximum PAE achievable is approximately 60%, using Vd of 3 V. If Vd and Vg biases were both fixed, the RF power amplifier would be performing at a much degraded PAE of approximately 28% when it is producing a reduced RF Pout of 11 dBm. In such a situation, where RF Pout is reduced to 11 dBm, the maximum PAE achievable by modulating Vd in plot 110 is approximately 45%, by tracking Vd down to 2 V. However, even being able to modulate Vd results in a PAE loss of about 15%.

FIG. 1B shows an example plot 120 illustrating experimental RF power amplifier envelope-tracking curves of varying Vg with a fixed Vd of 3 V, in accordance with an embodiment of this disclosure. Note that plot 120 in FIG. 1B was obtained by fixing the input matching to the RF power amplifier fabricated with a high-k III-V MOSFET, in accordance with an embodiment of this disclosure. In other words, modulation of Vg was possible by the use of a low leakage high-k gate dielectric stack, in accordance with an embodiment. Further note that, in such an embodiment, with envelope-tracking Vg modulation, the RF power amplifier Vg bias can be made to track the RF Pout. As can be seen in plot 120, Vg curves for three different voltage values are shown (from left to right, voltages of 0.5, 1, and 1.5 V). Tracking the RF Pout in plot 120, when RF Pout is 13 dBm, the maximum PAE achievable is approximately 60% using Vg of 1.5 V. When the RF power amplifier is producing a reduced RF Pout of 11 dBm, the maximum PAE achievable in plot 120 is still approximately 60% by tracking Vg down to 0.5 V. As previously described, if Vd and Vg biases were both fixed, the RF power amplifier would be performing at a much degraded PAE of approximately 28% when it is producing a reduced RF Pout of 11 dBm. In such a situation, where RF Pout is reduced to 11 dBm, the maximum PAE achievable by modulating Vg in plot 120 is approximately 60%, by tracking Vg down to 0.5 V. This results in an approximately 32% PAE improvement over the case of fixed Vd and Vg biases, and an approximately 15% improvement over the case of modulating just Vd, in this example. Therefore, the techniques and structures described herein can be used to realize double-digit percentage gains in RF PAE, in some embodiments.

In some cases, the gains in PAE and other benefits provided from the techniques and structures described herein may be realized as improved battery life for mobile devices employing such techniques and structures described herein. In some cases, the gains in PAE and other benefits may be realized as higher performance (e.g., data and call connectivity without loss of battery performance) for wireless communication devices employing the techniques and structures described herein. In some cases, the gains in PAE and other benefits may be realized in smart/mobile phones, tablet computing devices, and other mobile computing devices where such devices employ the techniques and structures described herein. In some embodiments, the envelope-tracking RF power amplifiers may be used in an RF base station to benefit from the advantages described herein. In some embodiments, group III element-nitride (III-N) compounds/materials may be particularly well-suited for III-V layers, due to III-N materials having high bandgaps and other desirable properties. III-N materials, as variously used herein, include a compound of one or more group III materials (e.g., aluminum, gallium, and/or indium), with nitrogen. Accordingly, III-N materials as variously used herein include, but are not limited to, GaN, InN, AlN, AlInN, AlGaN, InGaN, and AlInGaN.

Use of the techniques and structures provided herein may be detectable using tools such as scanning/transmission electron microscopy (SEM/TEM), composition mapping, x-ray crystallography or diffraction (XRD), secondary ion mass spectrometry (SIMS), time-of-flight SIMS (ToF-SIMS), atom probe imaging, local electrode atom probe (LEAP) techniques, 3D tomography, high resolution physical or chemical analysis, to name some suitable example analytical tools. In particular, such tools may indicate an RF power amplifier structure or device configured with one or more III-V MOSFETs as described herein. For example, in some embodiments, the III-V MOSFET structures may include a high-k gate dielectric stack including one or more layers of high-k dielectric materials. In some such embodiments, high-k dielectric materials may include materials having a dielectric constant, k, greater than that of silicon dioxide (e.g., a k value greater than approximately 3.9). Further, in some embodiments, the RF power amplifiers described herein may be detected by identifying that the voltage regulator is electrically connected to the gate of a III-V MOSFET (e.g., to modulate the Vg of the III-V MOSFET). In some such embodiments, an additional voltage regulator may be electrically connected to the drain of the III-V MOSFET (e.g., to modulate the Vd of the III-V MOSFET). In some cases, use of the techniques described herein may be detected based on the benefits derived from use of an envelope-tracking RF power amplifier including a III-V MOSFET with a high-k gate dielectric to enable Vg modulation, such as the efficiency improvements achieved from use of the techniques. Numerous configurations and variations will be apparent in light of this disclosure.

Architecture and Methodology

Figure 2:
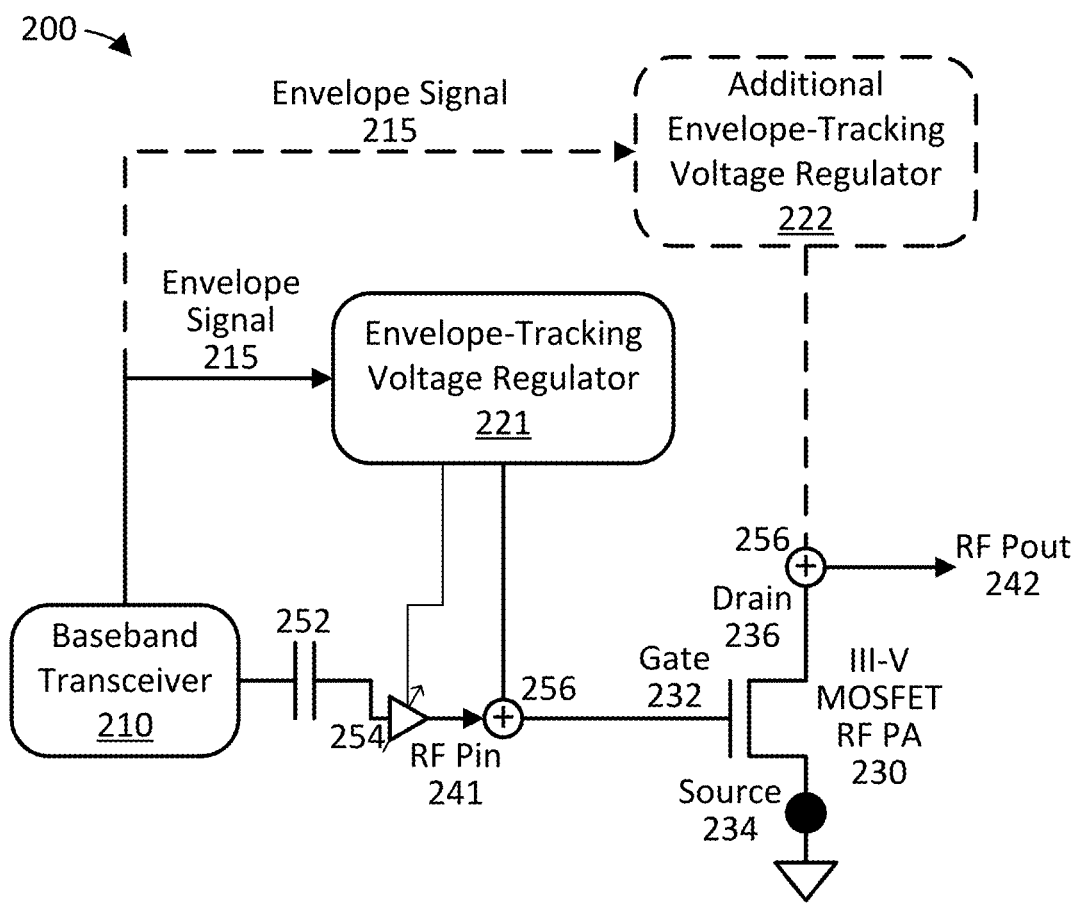
FIG. 2 illustrates an example envelope-tracking RF power amplifier (PA) architecture, in accordance with some embodiments of this disclosure.

FIG. 2 illustrates an example envelope-tracking radio frequency (RF) power amplifier (PA) architecture 200, in accordance with some embodiments of this disclosure. As will be apparent in light of this disclosure, architecture 200 includes a III-V semiconductor material MOSFET that enables envelope-tracking via Vg modulation to achieve high power amplifier efficiencies (e.g., PAE). Architecture 200 also includes an envelope-tracking voltage regulator 221 configured to modulate Vg of the III-V MOSFET RF power amplifier 230. FIG. 2 also shows a baseband transceiver 210 to illustrate the origin of the RF signal received by III-V MOSFET power amplifier 230 and the origin of the envelope signal 215 received by voltage regulator 221, in accordance with this example embodiment. Baseband transceiver 210, in this example embodiment, can be configured in any suitable manner, such as for 2G, 3G, 4G, LTE, and/or 5G communication formats. For example, the baseband transceiver 210 may simultaneously transmit envelope signal 215 and the RF signal (or RF power input (Pin) signal 241), such that voltage regulator 221 can modulate the Vg of the RF power amplifier 230. As will be descried in more detail below, in some embodiments, architecture 200 may also include additional envelope-tracking voltage regulator 222 that is configured to modulate the RF power amplifier Vd, which may lead to increased power amplifier efficiencies.

As can be understood based on this disclosure, RF power amplifier 230 may be used to convert a low-power RF signal (e.g., RF Pin 241) into a larger signal of significant power (e.g., RF output power (Pout) 242), which may be used for driving a transmitting antenna and/or exciting microwave cavity resonators, for example. Further, RF power amplifier may be used for voice and/or data communication applications, weather sensing applications (e.g., in the form of a radar), or for any other suitable application, as will be apparent in light of this disclosure. Accordingly, in the example architecture illustrated in FIG. 2, other suitable componentry may be included. For instance, a capacitor 252 and variable gain amplifier 254 arrangement can be implemented between the baseband transceiver 210 and the gate 232 of RF power amplifier 230 to assist with RF Pin 241, for example. In addition, adders 256 may be present in the architecture to sum two or more inputs and provide an output, such as summing an input provided from voltage regulator 221 with the RF Pin 241 provided from the baseband transceiver 210, for example. Numerous other suitable componentry will be apparent in light of the present disclosure.

In some embodiments, envelope-tracking voltage regulator 221 may include any suitable device(s), such as a modular DC-DC switching voltage converter, a buck converter, or any other device(s) capable of modulating the voltage of gate 232 (Vg) of III-V MOSFET RF power amplifier 230 in response to envelope signal 215. In some embodiments, envelope-tracking voltage regulator 221 may include a III-V MOSFET as described herein, such as a III-V MOSFET including a high-k gate dielectric stack described in more detail with reference to FIGS. 3 and 4, for example. In some embodiments, envelope-tracking voltage regulator 221 may be a high-speed voltage regulator, capable of operating at speeds of greater than 1, 5, 10, 20, 50, 100, or 150 MHz, for example. In the example embodiment shown in FIG. 2, envelope tracking voltage regulator 221 is electrically connected to the gate 232 of III-V MOSFET RF power amplifier 230. As will be apparent in light of this disclosure, modulation of Vg of RF power amplifier 230 by voltage regulator 221 may be enabled by the III-V MOSFET structure including a high-k gate dielectric stack, as will be described in more detail with reference to FIGS. 3 and 4. Envelope-tracking voltage regulator 221 may be configured in any suitable manner and with any suitable techniques to modulate Vg of RF power amplifier 230, depending on the end use or target application. Modulation of the Vg of RF power amplifier 230 using voltage regulator 221 may be performed, in this example embodiment, to improve the efficiency of the RF power amplifier 230. In some embodiments, voltage regulator 221 may be hard-coded or user-configurable, or some combination thereof. In some such embodiments, voltage regulator 221 may be configurable to increase efficiency of RF power amplifier 230 based on the baseband transceiver 210 architecture 200 is used with and/or based on the signals (e.g., envelope signal 215, RF signal 241) that architecture 200 receives, for example. As can also be seen in FIG. 2, source 234 and drain 236 of III-V MOSFET 230 are indicated.

In some embodiments, architecture 200 includes an optional additional envelope-tracking voltage regulator 222 configured to modulate the voltage of drain 236 (Vd). As can be understood, this additional voltage regulator 222 and the inputs/connections/outputs related thereto are shown in dashed lines in FIG. 2 to indicate that the additional voltage regulator 222 is optional and need not be included in every embodiment. In some cases, modulating Vd in addition to modulating Vg of III-V MOSFET RF power amplifier 230 may lead to increased power amplifier efficiencies, such as increased PAE, for example. In some embodiments, additional envelope-tracking voltage regulator 222 may include any suitable device(s), such as a modular DC-DC switching voltage converter, a buck converter, or any other device(s) capable of modulating Vd of power amplifier 230 in response to envelope signal 215. In some embodiments, additional envelope-tracking voltage regulator 222 may include a III-V MOSFET as described herein, such as a III-V MOSFET including a high-k gate dielectric stack described in more detail with reference to FIGS. 3 and 4, for example. In some embodiments, additional envelope-tracking voltage regulator 222 may be a high-speed voltage regulator, capable of operating at speeds of greater than 1, 5, 10, 20, 50, 100, or 150 MHz, for example. In the example embodiment shown in FIG. 2, envelope tracking voltage regulator 222 is electrically connected to the drain 236 of III-V MOSFET. Envelope-tracking voltage regulator 222 may be configured in any suitable manner and with any suitable techniques to modulate Vd of RF power amplifier 230, depending on the end use or target application. Modulation of the Vd of RF power amplifier 230 using voltage regulator 222 may be performed, in this example embodiment, to improve the efficiency of the RF power amplifier 230. In some embodiments, additional voltage regulator 222 may be hard-coded or user-configurable, or some combination thereof In some such embodiments, voltage regulator 222 may be configurable to increase efficiency of RF power amplifier 230 based on the baseband transceiver 210 architecture 200 is used with and/or based on the signals (e.g., envelope signal 215, RF signal 241) that architecture 200 receives, for example.

Figure 3:
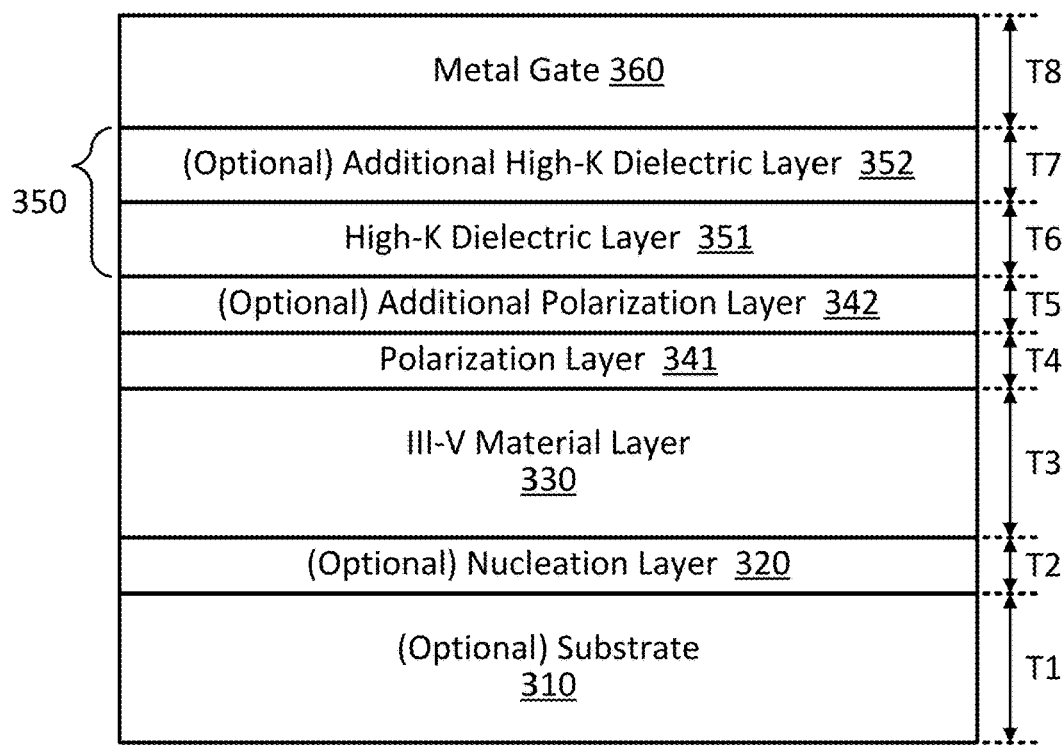
FIG. 3 illustrates an example stack of layers that may be used to form a III-V metal-oxide-semiconductor field-effect transistor (MOSFET) device including a high-k gate dielectric stack, in accordance with some embodiments. As will be apparent in light of this disclosure, the stack of layers shown in FIG. 3 may be the layers located under the metal gate of FIG. 4, for example.
Figure 4:
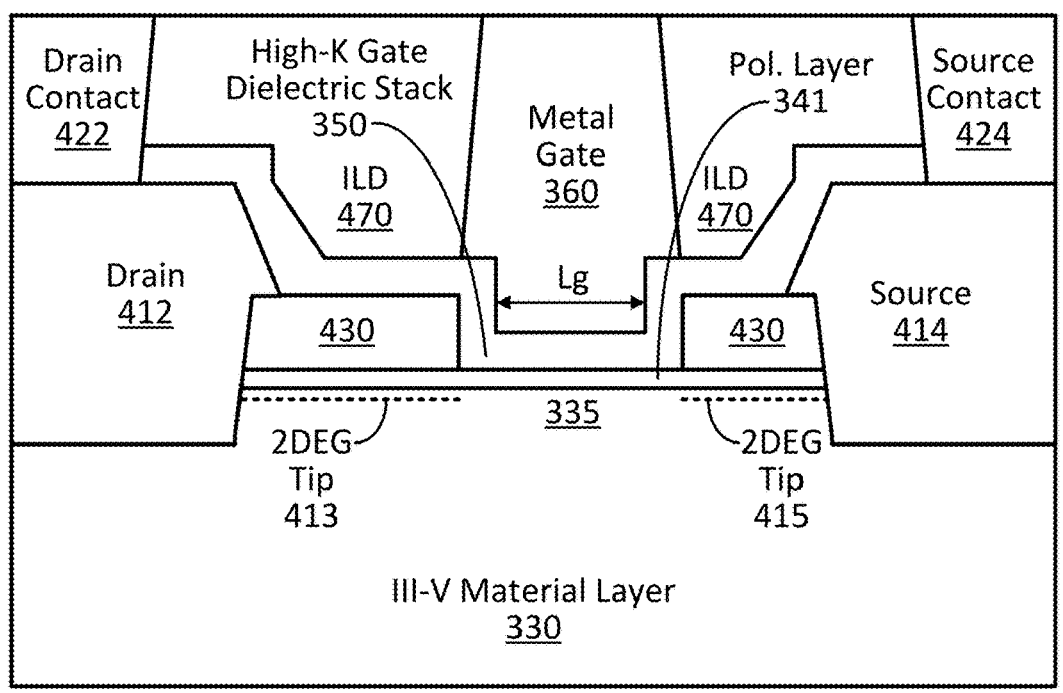
FIG. 4 illustrates an example III-V MOSFET device including a high-k gate dielectric stack, in accordance with some embodiments. As will be apparent in light of this disclosure, the III-V MOSFET device of FIG. 4 may be used as an RF power amplifier, for example. Note that the illustration of FIG. 4 is provided as a cross-sectional view along the orthogonal-to-gate direction.

FIG. 3 illustrates an example stack of layers that may be used to form a III-V MOSFET device including a high-k gate dielectric stack, in accordance with some embodiments. FIG. 4 illustrates an example III-V MOSFET device including a high-k gate dielectric stack, in accordance with some embodiments. As will be apparent based on this disclosure, the stack of layers shown in FIG. 3 may be the layers located under metal gate 360 of FIG. 4, for example. As will also be apparent in light of this disclosure, the III-V MOSFET device of FIG. 4 may be used as an RF power amplifier, such as RF power amplifier 230 in architecture 200 of FIG. 2, for example. The layers in the stack shown in FIG. 3 may be formed using any suitable techniques, such as one or more deposition or growth processes. In some embodiments, formation of one or more of the layers may be performed using metal-organic chemical vapor deposition (MOCVD), molecular-beam epitaxy (MBE) chemical vapor deposition (CVD), atomic layer deposition (ALD), physical vapor deposition (PVD), or any other suitable process as will be apparent in light of this disclosure. The structures of FIGS. 3 and 4 are primarily depicted, and described herein, in the context of a planar III-V MOSFET configuration. However, in some embodiments, non-planar III-V MOSFET configurations may be used, such as dual-gate configurations, finned configurations (e.g., FinFET or tri-gate), or gate-all-around configurations (e.g., including one or more nanowires or nanoribbons). Further still, the structures of FIGS. 3 and 4 are primarily described herein in the context of an n-type MOSFET (n-MOS) device. However, in some embodiments, the envelope-tracking techniques described herein may be used with a p-type MOSFET (p-MOS) device and/or a complementary MOSFET (CMOS) device. Further yet, the techniques as described herein may be used with devices of varying scales, such as transistor devices in the micrometer range or transistor devices in the nanometer range (e.g., transistors formed at the 22, 14, 10, 7, or 5 nm process nodes, or beyond).

In this example embodiment, the III-V semiconductor material layer 330 is formed above optional substrate 310. As will be apparent, in this example embodiment, III-V semiconductor material layer 330 will include the transistor channel. Substrate 310 is optional, because in some embodiments, the III-V material layer 330 may be a bulk III-V wafer, such that the base III-V layer is not formed above or on another material substrate, for example. However, in the example embodiment shown in FIG. 3, substrate 310 is present and base III-V layer 330 is formed above and the substrate 310. In some embodiments, substrate 310 may be a bulk substrate of one or more group IV materials/compounds, such as a bulk Si, Ge, SiC, or SiGe substrate, or substrate 310 may be a sapphire substrate, or substrate 310 may include any other suitable material, depending on the end use or target application. In some embodiments, substrate 310 may be an X on insulator (XOI) structure where X comprises Si, Ge, SiC, SiGe, or sapphire, and the insulator material is an oxide material or dielectric material or some other electrically insulating material. Although substrate 310 is illustrated in FIG. 3 as having a similar thickness as III-V layer 330, in some instances substrate 310 may be much thicker than base layer 330, such as on the order of at least 10, 100, or 1000 times thicker. For example, where substrate 310 is a bulk substrate, it may have a thickness T1 in the range of 50 to 950 microns. In some embodiments, substrate 310 (or III-V material layer 330, where it is a bulk III-V wafer and substrate 310 is not present) may be used for one or more other integrated circuit (IC) devices, such as various diodes (e.g., light-emitting diodes (LEDs) or laser diodes), various transistors (e.g., MOSFETs or tunnel FETs (TFETs)), various microelectromechanical systems (MEMS), various nanoelectromechanical systems (NEMS), various sensors, or any other suitable semiconductor or IC devices, depending on the end use or target application. Accordingly, in some embodiments, the III-V MOSFET RF power amplifier structures described herein may be included in different system-on-chip (SoC) applications, depending on the end use or target application.

In some embodiments, particularly where III-V layer 330 is formed on a non-III-V material substrate (e.g., on a Si, Ge, SiGe, SiC, or sapphire substrate), optional nucleation layer 320 may be formed between III-V layer 330 and substrate 310 to, for example, improve growth conditions and/or prevent the III-V layer 330 from reacting with the substrate material. In some such embodiments, nucleation layer 320 may include a III-V semiconductor material, such as AlN or a low temperature GaN layer (e.g., epitaxially grown at a temperature in the range of 700 to 950 degrees Celsius), for example. In some embodiments, optional nucleation layer 320 may have a multilayer structure including multiple III-V materials, which may or may not include grading (e.g., increasing and/or decreasing content) of one or more materials throughout the multilayer structure. Further, in some such embodiments, nucleation layer 320 may have any suitable thickness, such as a thickness T2 of 10 nm to 2 microns (e.g., 200 nm to 1 micron), or any other suitable thickness depending on the end use or target application. Note that substrate 310 and nucleation layer 320 are not shown in the structure of FIG. 4, as they are optional layers.

In some embodiments, III-V layer 330 may include any suitable materials, such as GaN, InGaN, other III-N materials, or any other suitable III-V material, depending on the end use or target application. For example, in some embodiments, group III element-nitride (III-N) compounds/materials may be particularly well-suited for III-V layer 330, due to III-N materials having high bandgaps and other desirable properties. III-N materials, as variously used herein, include a compound of one or more group III materials (e.g., aluminum, gallium, and/or indium), with nitrogen. Accordingly, III-N materials as variously used herein include, but are not limited to, GaN, InN, AlN, AlInN, AlGaN, InGaN, and AlInGaN. In some embodiments, III-V layer 330 may have a multilayer structure including multiple III-V materials, which may or may not include grading (e.g., increasing and/or decreasing content) of one or more materials throughout the multilayer structure. In some embodiments, III-V layer 330 may be formed to have a thickness T3 between 50 nm and 2 microns, or any other suitable thickness, depending on the end use or target application. In embodiments where substrate 310 is not present and III-V layer 330 is a bulk wafer, then III-V layer 330 may be substantially thicker, such as greater than 50 microns in thickness, for example.

In some embodiments, polarization layer 341 and optional additional polarization layer 342 may include any suitable materials, such as one or more III-V materials, and more specifically in some embodiments, one or more III-N materials (e.g., GaN, InN, AlN, AlInN, AlGaN, InGaN, and/or AlInGaN), for example. In some embodiments, optional additional polarization layer 342 need not be present in the material stack of FIG. 3 and the MOSFET structure of FIG. 4, as it is an optional layer. In some embodiments, polarization layer 341 may increase carrier mobility in the channel region, for example. Further, in some embodiments, polarization layer 341 may increase carrier mobility in source/drain extensions or tip portions, for example. In some embodiments, additional polarization layer 342, when present, may further increase carrier mobility in the channel region and/or the source/drain tip portions, for example. In some embodiments, additional polarization layer 342, when present, may improve the compatibility (e.g., density of interface traps) between polarization layer 341 and high-k dielectric layer 351, for example. In some embodiments, polarization layer 341 may have a thickness T4 of 0.1 to 20 nm (e.g., 0.5 to 3 nm), or any other suitable thickness, depending on the end use or target application. In some embodiments, when present, additional polarization layer 342 may have a thickness T5 of 0.1 to 20 nm (e.g., 0.5 to 3 nm), or any other suitable thickness, depending on the end use or target application.

In some embodiments, high-k dielectric layer 351 and optional additional high-k dielectric layer 352 may include any suitable materials, such as hafnium oxide (or hafnia), hafnium silicate, lanthanum oxide, lanthanum aluminum oxide, zirconium oxide, zirconium silicate, tantalum oxide, tantalum silicate, titanium oxide, barium strontium titanium oxide, barium titanium oxide, strontium titanium oxide, yttrium oxide, aluminum oxide, aluminum silicate, lead scandium tantalum oxide, and lead zinc niobate, to name some examples. In some such embodiments, high-k dielectric materials may include materials having a dielectric constant, k, greater than that of silicon dioxide (e.g., a k value greater than approximately 3.9). High-k dielectric layers 351 and 352 will be generally referred to herein as a high-k dielectric gate stack 350. However, in some embodiments, optional additional high-k dielectric layer 352 need not be present in the material stack of FIG. 3 and the MOSFET structure of FIG. 4, as it is an optional layer. Therefore, in some embodiments, high-k dielectric gate stack 350 may include at least one (and sometimes only one) high-k dielectric material layer.

In some embodiments, high-k dielectric layer 351 and additional dielectric layer 352, when present, may decrease gate leakage and provide a high input impedance, thereby enabling the use of envelope-tracking control techniques that modulate Vg of an RF power amplifier, such as III-V MOSFET RF power amplifier 230 of architecture 200. For example, in some embodiments, the use of one or more high-k dielectric films on a III-N/GaN transistor channel (e.g., where polarization layer 341 is a III-N material and III-V material layer 330 is GaN) can result in at least a 100, 1000 10000, or 100000 times reduction in gate leakage compared to, for example, a Schottky gate configuration. In some embodiments, the properties of high-k dielectric layer 351 (such as the material and thickness) may be selected based at least in part on the properties of the underlying polarization layer(s), such as additional polarization layer 342, when present. In some embodiments, additional dielectric layer 352, when present, may be included to increase compatibility between the high-k gate dielectric stack 350 and metal gate 360, for example. In some embodiments, high-k dielectric layer 351 may have a thickness T6 of 0.1 to 20 nm (e.g., 1-4 nm), or any other suitable thickness, depending on the end use or target application. In some embodiments, when present, additional high-k dielectric layer 352 may have a thickness T7 of 0.1 to 20 nm (e.g., 1-4 nm), or any other suitable thickness, depending on the end use or target application.

For illustrative purposes, the table below provides twelve different example combinations for high-k dielectric layer 351, optional additional high-k dielectric layer 352, polarization layer 341, and optional additional polarization layer 342, in accordance with some embodiments. Note that example materials for the layers are listed along with example thickness ranges in parentheses.

| # | High-K Dielectric Layer | (Optional) Additional High-K Dielectric Layer | Polarization Layer | (Optional) Additional Polarization Layer |
|---|---|---|---|---|
| 1 | AlSiO$y$ (1-4 nm) | — | AlN (0.5-3 nm) | Al0.83In0.17N (0.5-1.5 nm) |
| 2 | Al2O3 (1-4 nm) | — | AlN (0.5-3 nm) | Al0.83In0.17N (0.5-1.5 nm) |
| 3 | HfO2 (1-4 nm) | — | AlN (0.5-3 nm) | GaN |
| 4 | ZrO2 (1-4 nm) | — | AlN (0.5-3 nm) | Al0.83In0.17N (0.5-1.5 nm) |
| 5 | TaSiO$y$ (1-4 nm) | — | AlN (0.5-3 nm) | Al0.83In0.17N (0.5-1.5 nm) |
| 6 | HfO2 (1-4 nm) | AlSiO$y$ (1-4 nm) | AlN (0.5-3 nm) | Al0.83In0.17N (0.5-1.5 nm) |
| 7 | HfO2 (1-4 nm) | Al2O3 (1-4 nm) | AlN (0.5-3 nm) | Al0.83In0.17N (0.5-1.5 nm) |
| 8 | HfO2 (1-4 nm) | — | AlN (0.5-3 nm) | Al0.83In0.17N (0.5-1.5 nm) |
| 9 | HfO2 (1-4 nm) | Al2O3 (1-4 nm) | AlN (0.5-3 nm) | — |
| 10 | HfO2 (1-4 nm) | AlSiO$y$ (1-4 nm) | AlN (0.5-3 nm) | — |
| 11 | AlSiO$y$ (1-4 nm) | — | AlN (0.5-3 nm) | — |
| 12 | Al2O3 (2-4 nm) | — | AlN (0.5-3 nm) | — |

In some embodiments, metal gate 360 may include any suitable materials, such as titanium nitride (TiN), nickel (Ni), gold (Au), copper (Cu), or other suitable soft metals, for example. In some embodiments, the metal gate 360 may be formed by depositing the metal layer and patterning the metal material to form the metal gate structure 360 shown in FIG. 4, for example. Note that although the 360 gate of the example transistor structure shown in FIGS. 3 and 4 is illustrated and described herein as a metal gate, in some embodiments, the gate may not include any metal material and may instead include, for example, polysilicon (polycrystalline silicon) material. In some embodiments, the gate 360 may include a multi-layer structure that has two or more material layers, which may or may not include grading (e.g., increasing and/or decreasing) the content of one or more materials throughout the multi-layer structure. For instance, in some embodiments, gate 360 may include at least one interfacial layer (e.g., at least one workfunction material layer) to improve interface quality and/or electric properties between the gate dielectric (e.g., high-k gate dielectric stack 350) and gate 350 materials, for example. In some embodiments, an envelope-tracking voltage regulator (e.g., voltage regulator 221 shown in FIG. 2) may be electrically connected to metal gate 360 to modulate the bias of the gate 360 voltage (Vg). In some such embodiments, the electrical connection can be made in any suitable manner, such as using a metal interconnect, for example. As can be seen in FIG. 4, channel region 335 in III-V material layer 330 is under the gate stack, which includes high-k gate dielectric stack 350 and metal gate 360. The gate length Lg, drain 412, and source 414 are also shown in FIG. 4, as well as polarization layer 430 which may be used to form two-dimensional electron gas (2DEG) tip portions or tips (or extensions) 413 and 415, all of which will be described in more detail below.

In some embodiments, drain 412 and source 414 may include any suitable materials, such as a III-V material, a III-N material, and/or any other suitable materials, depending on the end use or target application. In some embodiments, drain 412 and source 414 may be formed using any suitable techniques, such as one or more deposition processes. In addition, in some embodiments, the drain 412 and source 414 may be doped in an n-type or p-type manner, for example, using any suitable doping techniques. In an example embodiment, drain 412 and source 414 are formed with InN or InGaN doped in an n-type manner using Si with doping amounts of around 2E20 per cubic cm. As can be understood based on this disclosure, in this example embodiment, the drain region includes both drain 412 and 2DEG tip 413 and the source region includes source 414 and 2DEG tip 415. The 2DEG tips 413 and 414 may be formed using polarization layer 430, for example. Note that polarization layer 430 is yet another additional optional polarization layer, and is different from optional additional polarization layer 342 (which would be located under metal gate 360 if present in FIG. 4). In some embodiments, the polarization layer 430 material may include a III-V material or a III-N material (e.g., GaN, InN, AlN, AlInN, AlGaN, InGaN, and AlInGaN), or any other suitable material, depending on the end use or target application. In some embodiments, polarization layer 430 may have a thickness (e.g., between layer 341 and layer 350) of 2-100 nm (e.g., 5-10 nm), or any other suitable thickness depending on the end use or target application. In some cases, the thickness and composition of polarization layer 430 may dictate the magnitude of a polarization vector formed, and thus the amount of charge (and corresponding conductivity) in the 2DEG tips 413 and 415.

In this example embodiment, drain 2DEG tip 413 is illustrated as longer (the length between source 412 and channel 335) than source 2DEG tip 415 (the length between drain 414 and channel 335). For example, in this embodiment, the length of drain 2DEG tip 413 may be 40 to 250 nm, and the length of source 2DEG tip may be 10 to 100 nm and shorter than the length of drain 2DEG tip 413. However, this disclosure is not intended to be so limited. In some embodiments, the lengths of the drain and source tips 413 and 415 may be any suitable length, and they may be equal (or approximately equal) in some cases, the length of the source tip 415 may be longer than the length of the drain tip 413, or the length of the drain tip 413 may be longer than the length of the source tip 415 (as is the case in the structure of FIG. 4), for example. In some embodiments, the source/drain tips may be formed using other suitable techniques, such as via implant and diffusion processes, for example. In some embodiments, one or both of the source and drain regions need not have tips or extensions, for example. In some embodiments, the transistor structure may include spacers (also referred to as side-wall spacers) on either side of the gate, and the source and drain portions may be located under the spacers. Such spacers may be present when a replacement metal gate process is used to form the transistor structure, for example. Note that the use of 2DEG tips may prevent tip overrun (e.g., as compared to use of implanted and diffused tips), such that the channel region 335 length tracks very closely with the gate length Lg. In some embodiments, the gate length Lg (which may closely approximate the channel length) may be 70 to 150 nm (e.g., less than 100 nm) in length, or have any other suitable length, depending on the end use or target application.

Source contact 422 and drain contact 424 are also shown in the example structure in FIG. 4. Source and drain contacts 422 and 424 may be formed using any suitable technique, such as using one more deposition and/or patterning processes. In some embodiments, the source and drain contacts 422 and 424 may be titanium (Ti), platinum (Pt), Au, or other suitable hard metals, for example. In some embodiments, an envelope-tracking voltage regulator (e.g., voltage regulator 222 shown in FIG. 2) may be electrically connected to drain 414 using contact 424 to modulate the bias of the drain 414 voltage (Vd). In some such embodiments, the electrical connection can be made in any suitable manner, such as using a metal interconnect, for example. Interlayer dielectric (ILD) material 470 is also shown as deposited over the structure to, for example, electrically insulate/isolate features, such as the drain contact 422, metal gate 360, and source contact 424. As previously described, in embodiments including modulation of Vd in addition to modulation of Vg of a III-V MOSFET RF power amplifier may lead to increased efficiencies, such as increased PAE, for example. Note that the example structure shown in FIG. 4 be used for a transistor operating in enhancement mode (e.g., to enable use of positive voltage to control the power amplifier including such a transistor). In some embodiments, other suitable configurations may be used to enable depletion mode operation of the transistor, as can be understood based on this disclosure.

In some embodiments, the topography of the structures formed using the techniques described herein may be varied, as a result of desired processes and/or as a result of real-world fabrication. For instance, in the example embodiment of FIG. 4, note how the source 414 and drain 412 regions are sloped to partially land on polarization layer 430. Also note, in this example embodiment, the conformal nature of high-k dielectric stack 350, and how the stack 350 at least partially covers the source 414 and drain 412 regions that extend upward from the III-V material layer 330. In some embodiments, the high-k dielectric stack 350 may be formed only in the gate region (e.g., only under metal gate 360), such as in structures that include side-wall spacers, for example. Further note that in some embodiments, the source 412 and/or drain 414 regions may include sloped walls which extend upward from the III-V layer 330, and which may track with sloped walls of the gate 360. Thus, the high-k dielectric stack 350, in an example embodiment, may track with the slopes of those features as well, when it is formed as a conformal layer as shown in FIG. 4.

Figure 5A:
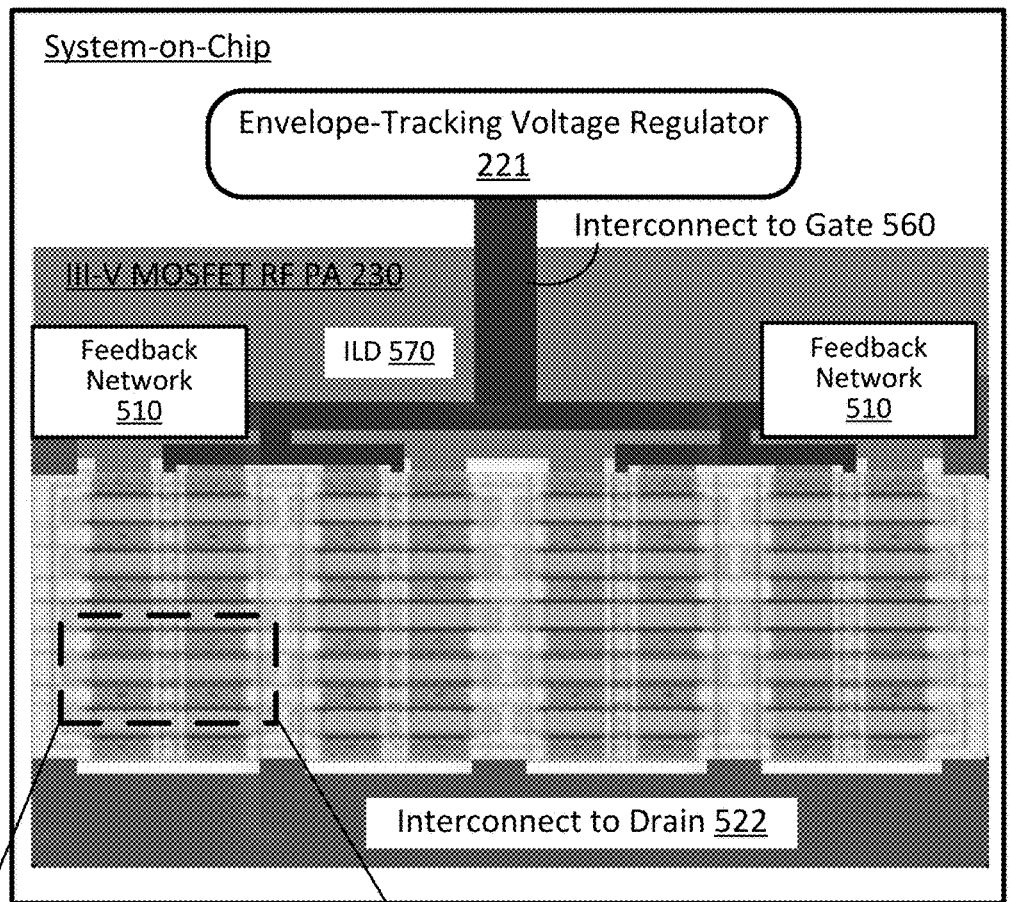
FIG. 5A illustrates a top-down view of an example system-on-chip configured with an example envelope-tracking RF PA architecture, in accordance with some embodiments of this disclosure.

FIG. 5A illustrates a top-down view of an example system-on-chip configured with an envelope-tracking RF PA architecture, in accordance with some embodiments of this disclosure. As can be seen in FIG. 5A, the architecture illustrated is similar to the architecture 200 illustrated in FIG. 2. Therefore, the previous relevant description with respect to architecture 200 is equally applicable to the architecture of FIG. 5A. For instance, in this example embodiment, envelope-tracking voltage regulator 221 is illustrated as being electrically connected to III-V MOSFET RF PA 230, as was the case in architecture 200 of FIG. 2. The top-down view of FIG. 5A is provided to generally illustrate this electrical connection, in accordance with some embodiments. Voltage regulator 221 may be detected by first locating its VR components, for example. For instance, in embodiments where VR 221 is a buck VR circuit, it may include a circuit arrangement of two transistors, two inductors, and a capacitor (in various implementations), which can be detected from a top-down view of the same. The VR output electrical connection to the III-V MOSFET RF PA 230 may be observed from the top-down view, which may be a cross-sectional view along or above the interconnect between VR 221 and RF PA 230, for example. Such a cross-sectional view may be taken along or above metallization layers 0 and/or 1 (e.g., M0 and/or M1), for example. For example, interconnect wires 560 to the gate of RF PA 230 and interconnect wires 522 to the drain of RF PA 230 at M1 are illustrated in FIG. 5A, along with feedback networks 510 (which may include passives, such as resistors, inductors, and/or capacitors, for example) and inter-layer dielectric (ILD) material 570 (which may be used to help electrically insulate/isolate the interconnects, for example). Note that in the example embodiment illustrated in FIG. 5A, the III-V MOSFET RF PA 230 is a large-width transistor (e.g., Z=1 mm) with multiple smaller-width (e.g., Z=20 microns) III-V transistors interconnected together, where one or more of the III-V transistors connected together may be formed using the techniques described herein.

Figure 5B:
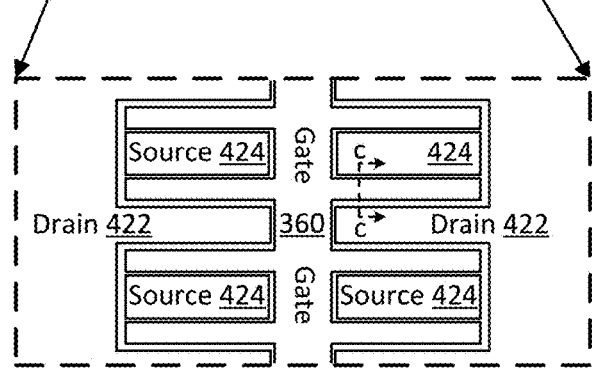
FIG. 5B illustrates an enlarged view of a portion of the RF PA structure in FIG. 5A, in accordance with an embodiment.
Figure 5C:
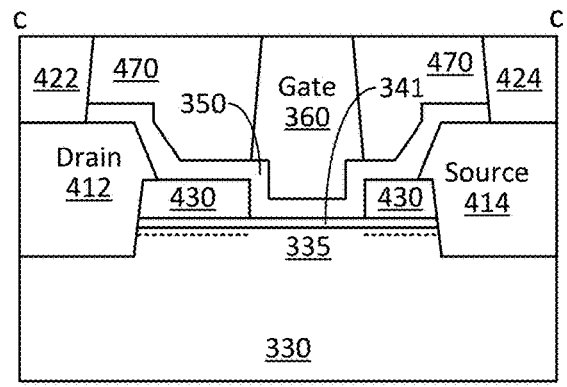
FIG. 5C is provided to illustrate that the structure of FIG. 4 may be taken along the cross-sectional indicator C-C in FIG. 5B, in accordance with an embodiment.

FIG. 5B illustrates an enlarged view of a portion of the RF PA 230 structure in FIG. 5A, in accordance with an embodiment. More specifically, the enlarged view illustrates the portion of RF PA 230 that is indicated with a dashed rectangle, as shown. As can be seen in FIG. 5B, the drain contacts 422, source contacts 424, and gate 360 are shown, which may be considered the M0 interconnects, for example. In addition, in this example embodiment, the gate fingers are shown extending between the source 424 and drain 422 contacts. The top-down view of FIG. 5B also includes a cross-sectional indicator C-C that illustrates an example orthogonal-to-gate perspective for the structure of FIG. 4, in accordance with an embodiment. For ease of illustration, the structure of FIG. 4 is provided as FIG. 5C, to illustrate the different views of the structure on a single sheet, in accordance with an embodiment. Numerous variations and configurations will be apparent in light of this disclosure.

Example System

Figure 6:
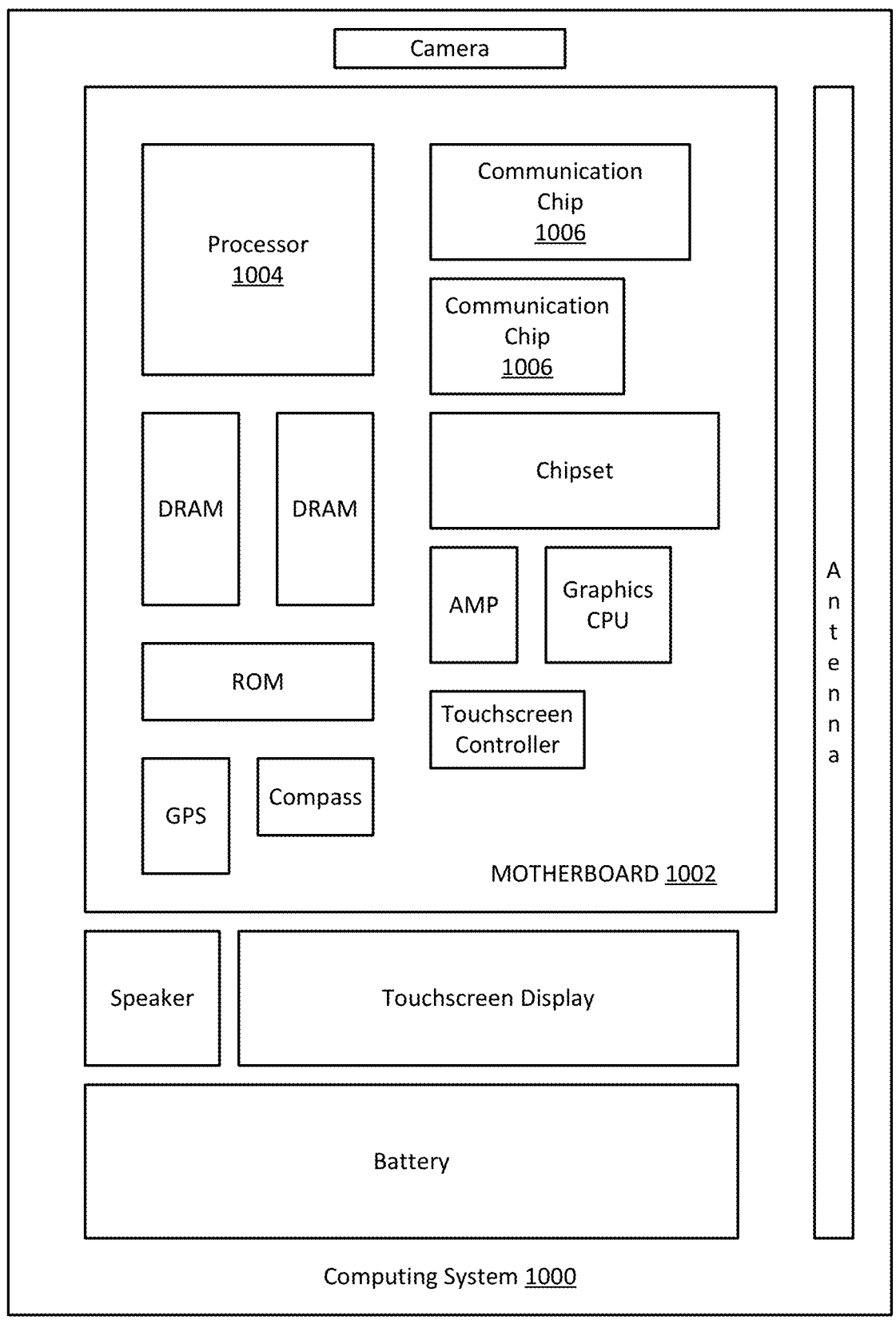
FIG. 6 illustrates a computing system implemented with integrated circuit structures or devices formed using the techniques disclosed herein, in accordance with an embodiment of this disclosure.

FIG. 6 illustrates a computing system 1000 implemented with integrated circuit structures or devices formed using the techniques disclosed herein, in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, communication chip 1006 may include one or more envelope-tracking RF power amplifiers as variously described herein.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a power amplifier transistor including: a channel including a III-V semiconductor material; a gate above the channel; a high-k gate dielectric stack including at least one high-k dielectric material layer between the channel and the gate; and source and drain regions adjacent to the channel; wherein the gate is electrically connected to a voltage regulator. In some example embodiments, the voltage regulator is configured to modulate a voltage applied to the gate in response to an envelope signal (and the envelope signal may be received from a baseband transceiver, for example).

Example 2 includes the subject matter of Example 1, wherein the high-k gate dielectric stack is conformal to and located on at least a portion of the source and drain regions.

Example 3 includes the subject matter of any of Examples 1-2, wherein the voltage regulator is configured to operate at speeds of at least 100 MHz.

Example 4 includes the subject matter of any of Examples 1-3, wherein the channel includes a group III material-nitride (III-N) compound.

Example 5 includes the subject matter of any of Examples 1-4, wherein the channel includes gallium nitride (GaN).

Example 6 includes the subject matter of any of Examples 1-5, wherein the high-k gate dielectric stack has only one high-k dielectric layer.

Example 7 includes the subject matter of any of Examples 1-5, wherein the high-k gate dielectric stack includes at least two high-k dielectric material layers.

Example 8 includes the subject matter of any of Examples 1-7, wherein the at least one high-k dielectric material layer includes at least one of hafnium oxide, hafnium silicate, aluminum oxide, aluminum silicate, tantalum oxide, tantalum silicate, zirconium oxide, and zirconium silicate.

Example 9 includes the subject matter of any of Examples 1-8, wherein the high-k gate dielectric stack has a thickness between the channel and the metal gate of less than 10 nm.

Example 10 includes the subject matter of any of Examples 1-9, further including at least one group III material-nitride (III-N) compound polarization layer between the channel and the high-k gate dielectric stack.

Example 11 includes the subject matter of any of Examples 1-10, wherein the gate is a metal gate.

Example 12 includes the subject matter of any of Examples 1-11, wherein the drain region is electrically connected to another voltage regulator.

Example 13 includes the subject matter of Example 12, wherein the other voltage regulator is configured to modulate a voltage applied to the drain region in response to an envelope signal.

Example 14 includes the subject matter of any of Examples 1-13, wherein the transistor is an n-type transistor.

Example 15 includes the subject matter of any of Examples 1-14, wherein the transistor has a planar configuration.

Example 16 includes the subject matter of any of Examples 1-14, wherein the transistor has a non-planar configuration.

Example 17 is a computing system including the subject matter of any of Examples 1-16.

Example 18 is an envelope-tracking radio frequency (RF) power amplifier including: a metal-oxide semiconductor field-effect transistor (MOSFET) including: a III-V semiconductor material channel; a metal gate above the channel; a high-k gate dielectric stack including at least one high-k dielectric material layer between the channel and the metal gate; and source and drain regions adjacent to the channel; and a voltage regulator electrically connected to the metal gate of the MOSFET. In some example embodiments, the voltage regulator is configured to modulate a voltage applied to the gate in response to an envelope signal (and the envelope signal may be received from a baseband transceiver, for example).

Example 19 includes the subject matter of Example 18, wherein the high-k gate dielectric stack is conformal to and located on at least a portion of the source and drain regions.

Example 20 includes the subject matter of any of Examples 18-19, wherein the voltage regulator is configured to operate at speeds of at least 100 MHz.

Example 21 includes the subject matter of any of Examples 18-20, wherein the channel is a group III material-nitride (III-N) compound.

Example 22 includes the subject matter of any of Examples 18-21, wherein the channel includes gallium nitride (GaN).

Example 23 includes the subject matter of any of Examples 18-22, wherein the high-k gate dielectric stack includes only one high-k dielectric layer.

Example 24 includes the subject matter of any of Examples 18-22, wherein the high-k gate dielectric stack includes at least two high-k dielectric material layers.

Example 25 includes the subject matter of any of Examples 18-24, wherein the at least one high-k dielectric material layer includes at least one of hafnium oxide, hafnium silicate, aluminum oxide, aluminum silicate, tantalum oxide, tantalum silicate, zirconium oxide, and zirconium silicate.

Example 26 includes the subject matter of any of Examples 18-25, wherein the high-k gate dielectric stack has a thickness between the channel and the metal gate of less than 10 nm.

Example 27 includes the subject matter of any of Examples 18-26, further including at least one III-V semiconductor material polarization layer between the channel and the high-k gate dielectric stack.

Example 28 includes the subject matter of Example 27, wherein the at least one polarization layer material is a group III material-nitride (III-N) compound.

Example 29 includes the subject matter of any of Examples 18-28, further including an additional voltage regulator electrically connected to the drain region of the MOSFET.

Example 30 includes the subject matter of Example 29, wherein the additional voltage regulator is configured to modulate a voltage applied to the drain region of the MOSFET in response to an envelope signal.

Example 31 includes the subject matter of any of Examples 18-30, wherein the MOSFET is an n-type MOSFET.

Example 32 includes the subject matter of any of Examples 18-31, wherein the MOSFET has a planar configuration.

Example 33 includes the subject matter of any of Examples 18-31, wherein the MOSFET has a non-planar configuration.

Example 34 is a computing system including the subject matter of any of Examples 18-33.

Example 35 is a method of envelope tracking for a radio frequency (RF) power amplifier, the method including: receiving an envelope signal at a voltage regulator; and modulating a voltage applied by the voltage regulator based on the envelope signal, the voltage applied to a gate of a transistor, wherein the transistor includes: a channel below the gate, wherein the channel includes a III-V semiconductor material; a high-k gate dielectric stack including at least one high-k dielectric material layer between the channel and the gate; and source and drain regions adjacent to the channel.

Example 36 includes the subject matter of Example 35, wherein the voltage regulator is configured to operate at speeds of at least 100 MHz.

Example 37 includes the subject matter of any of Examples 35-36, wherein the channel includes a group III material-nitride (III-N) compound.

Example 38 includes the subject matter of any of Examples 35-37, wherein the channel includes gallium nitride (GaN).

Example 39 includes the subject matter of any of Examples 35-38, wherein the high-k gate dielectric stack includes only one high-k dielectric layer.

Example 40 includes the subject matter of any of Examples 35-38, wherein the high-k gate dielectric stack includes at least two high-k dielectric material layers.

Example 41 includes the subject matter of any of Examples 35-40, wherein the at least one high-k dielectric material layer includes at least one of hafnium oxide, hafnium silicate, aluminum oxide, aluminum silicate, tantalum oxide, tantalum silicate, zirconium oxide, and zirconium silicate.

Example 42 includes the subject matter of any of Examples 35-41, wherein the high-k gate dielectric stack has a thickness between the channel and the metal gate of less than 10 nm.

Example 43 includes the subject matter of any of Examples 35-42, further including at least one group III material-nitride (III-N) compound polarization layer between the channel and the high-k gate dielectric stack.

Example 44 includes the subject matter of any of Examples 35-43, wherein the gate is a metal gate.

Example 45 includes the subject matter of any of Examples 35-44, further including modulating another voltage applied by another voltage regulator based on the envelope signal, the other voltage applied to the drain region of the transistor.

The foregoing description of example embodiments has been presented for the purposes of illustration and description. It is not intended to be exhaustive or to limit this disclosure to the precise forms disclosed. Many modifications and variations are possible in light of this disclosure. It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including at least one transistor, the integrated circuit comprising:
   a body including group III-V semiconductor material;
   a gate electrode at least above the body, the gate electrode including one or more metals;
   a first layer between the body and the gate electrode, the first layer comprising at least one of aluminum nitride, aluminum indium nitride, aluminum gallium nitride, and aluminum indium gallium nitride;
   a second layer between the first layer and the gate electrode, the second layer including one or more high-k dielectrics; and
   a source region and a drain region, the source and drain regions adjacent to the body, the source and drain regions including semiconductor material.

2. The integrated circuit of claim 1, wherein the second layer is conformal to and directly in contact with at least a portion of the source and drain regions.

3. The integrated circuit of claim 1, wherein the gate electrode is electrically connected to a voltage regulator.

4. The integrated circuit of claim 1, wherein the group III-V semiconductor material included in the body includes nitrogen.

5. The integrated circuit of claim 4, wherein the group III-V semiconductor material included in the body further includes gallium.

6. The integrated circuit of claim 1, wherein the second layer includes two or more high-k dielectrics that are compositionally different.

7. The integrated circuit of claim 1, wherein the one or more high-k dielectrics included in the second layer includes oxygen or silicon, or both oxygen and silicon.

8. The integrated circuit of claim 7, wherein the one or more high-k dielectrics included in the second layer includes hafnium.

9. The integrated circuit of claim 1, wherein the second layer has a thickness between the body and the gate electrode of less than 10 nanometers.

10. The integrated circuit of claim 1, further comprising a third layer between portions of the first and second layers, the third layer including aluminum, indium, and nitrogen.

11. The integrated circuit of claim 1, wherein the gate electrode includes one or more of titanium, nickel, and gold.

12. The integrated circuit of claim 1, wherein the drain region is electrically connected to a voltage regulator.

13. The integrated circuit of claim 1, wherein the source and drain regions further include n-type dopant.

14. The integrated circuit of claim 1, wherein the body is a fin, the fin between two portions of the gate electrode.

15. The integrated circuit of claim 1, wherein the gate electrode is around the body.

16. A computing system comprising the integrated circuit of claim 1.

17. An integrated circuit including at least one transistor, the integrated circuit comprising:
- a body including gallium and nitrogen;
- a gate electrode at least above the body, the gate electrode including one or more metals;
- a first layer between the body and the gate electrode, the first layer including aluminum and nitrogen;
- a second layer between the first layer and the gate electrode, the second layer including one or more high-k dielectrics;
- a third layer between portions of the first and second layers, the third layer including aluminum, indium, and nitrogen; and
- a source region and a drain region, the body between the source and drain regions, the source and drain regions including semiconductor material;
- wherein the gate electrode is electrically connected to a voltage regulator.

18. The integrated circuit of claim 17, further comprising a third layer between the second layer and the gate electrode, the third layer include one or more high-k dielectrics, wherein the second and third layers include compositionally different material.

19. The integrated circuit of claim 17, wherein the first layer includes a thickness between 0.5 and 3 nanometers.

20. The integrated circuit of claim 10, wherein the first layer comprises aluminum nitride.

\* \* \* \* \*